United States Patent [19]

Newhouse

[11] Patent Number: 4,751,162
[45] Date of Patent: Jun. 14, 1988

[54] PHOTOENGRAVING ARTICLES OF ZINC-FREE MAGNESIUM-BASED ALLOYS AND METHODS OF PRODUCING SUCH ARTICLES

[75] Inventor: Geoffrey S. Newhouse, Aurora, Colo.

[73] Assignee: The Dow Chemical Company, Midland, Mich.

[21] Appl. No.: 898,478

[22] Filed: Aug. 21, 1986

[51] Int. Cl.$^4$ .......................... B41N 3/02; C22C 23/02
[52] U.S. Cl. .................................... 430/12; 156/659.1; 156/905; 420/402; 420/407; 430/279; 430/310
[58] Field of Search ....................... 420/402, 407, 408; 156/659.1, 905; 430/300, 12, 279, 310; 101/458, 459, 150

[56] References Cited

U.S. PATENT DOCUMENTS 1,698,647  1/1929  Michel .................................. 420/402
3,340,195  9/1967  Borth et al. ......................... 156/905

FOREIGN PATENT DOCUMENTS 658707  10/1951  United Kingdom ................ 420/407
776649   6/1957  United Kingdom ................ 420/407

Primary Examiner—L. Dewayne Rutledge
Assistant Examiner—Robert L. McDowell
Attorney, Agent, or Firm—Stephen M. Roylance; John L. White

[57] ABSTRACT

A photoengraving article is provided formed of an essentially zinc-free magnesium-based alloy which also contains an amount of calcium effective to control lateral etching and improvement the sharpness of the resultant etched pattern. A method of forming a photoengraved article is also provided. The method comprises the steps of forming a photoengraving article from a photoengraving alloy and etching a pattern on the article in an etching bath. The improvement that comprises forming the photoengraving article from essentially zinc-free magnesium-based alloys containing an amount of calcium effective to control the lateral etching and improve the clarity of the resultant pattern. The article and method do not release zinc into the etching bath. Ultimate release of zinc into the environment is also reduced.

26 Claims, No Drawings

PHOTOENGRAVING ARTICLES OF ZINC-FREE MAGNESIUM-BASED ALLOYS AND METHODS OF PRODUCING SUCH ARTICLES

This invention relates to photoengraving articles, i.e., articles which are adapted to be etched to form photoengraved articles, e.g., photoengraved printing plates, sheets, cylinders, etc., to methods for forming such photoengraved articles and to the thus-produced photoengraving articles.

BACKGROUND OF THE INVENTION

Photoengraving involves the manufacture of photoengraved printing articles. The manufacture of such articles involves coating a metal substrate, e.g., plate, sheet or cylinder with a light-sensitive material. The light-sensitive material is then transformed in selected areas by the action of light with or without the assistance of heat into an etch resistant pattern. This pattern is known in the art as a photo resist pattern. This photo resist pattern comprises portions which can be selectively removed from the metal by dissolving those portions to produce a metal substrate having a photo resist pattern through which bare metal is exposed.

The bare metal pattern is then etched, i.e, metal is removed therefrom, to a sufficient depth to permit a printing process to take place or for the preparation of mats. Typical etching depths range from about 0.004 inch, e.g., for half tones, to about 0.040 inch for letterpress work and up to about 0.150 inch for flexographic masters.

Typically, a plate having both the image (resist protected) and non-image (bare metal) areas is placed in a commercial etcher for etching. Various types of etchers are used and these are generally of such character that droplets of an etching liquid are directed against the surface of the plate to be etched. The etching liquid removes a portion of the bare metal and an etched pattern on the substrate results.

A disadvantage of prior art photoengraving articles formed of conventional photoengraving alloys relates to the presence of zinc in such alloys. When such alloys are etched with an etching bath which contains an etchant oil composition, zinc is released into the etching oil effluent. The presence of zinc in the effluent is a cause of environmental concern.

Prior art photoengraving alloys contain zinc as a means as regulating the etching process, e.g., as a means of regulating the etching speed and also as a means for providing a clean, clear etched pattern. Particularly with the use of early etchant oil compositions, if the photoengraving article were formed of an alloy which did not contain zinc, the resultant pattern on the etched article was not acceptable. Typically, the etched pattern would include pimples, undercut portions resulting from lateral etching and rough edges. As used herein, lateral etching refers to undesirable etching of metal protected by the photoresist.

Significant advancement has ocurred in the field of etchant oil compositions. Thus, etchant oil compositions which include isostearic acid have become available. These are exemplified in U.S. Pat. Nos. 3,935,118; 4,032,379; 3,992,234; 3,922,229; 3,736,197; 3,730,899; 3,728,180; 3,725,158 and 3,725,159.

As used herein, "etchant oil" refers to compositions such as those exemplified in the above patents, which are used to prepare etching baths. As used herein, "etching baths" refers to the composition applied to a photoengraving article to conduct the etching processes defined more fully herein. Because zinc-free magnesium-based photoengraving alloys functioned unacceptably with etching baths containing early etchant oil compositions, it was expected that they would function unacceptably with recent etchant oils.

U.S. Pat. No. 1,028,216 discloses the melting and casting of magnesium in the presence of small amounts of calcium. The calcium is added to the magnesium or an unidentified alloy thereof. Zinc is not a component of the alloys of the examples. The alloys are not disclosed as being useful in photoengraving processes.

U.S. Pat. No. 1,698,647 contains a similar disclosure. The magnesium alloy contains 0.05-0.3 percent calcium.

British Pat. No. 661,759 refers to a laid-open British patent application which discloses a magnesium-based alloy containing 1-12 percent aluminum, 0.05-1 percent manganese and 0.005-0.7 percent zirconium. Up to 5% zinc may also be present. The alloy is formulated with or without the zinc. The alloys are not disclosed as being useful in photoengraving.

U.S. Pat. Nos. 2,185,452 and 2,185,453 disclose magnesium alloys containing about 1-12 percent aluminum, about 0.3-5 percent zinc, about 0.05-0.3 percent manganese and about a 0.03-0.3 percent calcium, the balance being magnesium.

U.S. Pat. No. 3,475,140 discloses a composite printing plate formed of a magnesium alloyed layer bonded to an aluminum layer. The magnesium alloys are standard alloys known as PE alloys, which do not contain calcium.

Canadian Pat. No. 594,432; British Pat. No. 661,759 and *Letterpress Platemaking*, F. G. Wallis (publication date unknown) disclose magnesium-based photoengraving alloy compositions containing both calcium and zinc.

OBJECTS OF THE INVENTION

It is an object of this invention to provide a photoengraving article which is essentially zinc-free and which does not release zinc into the etching bath effluent.

Another object of this invention is to provide a photoengraving article formed of a magnesium-based, essentially zinc-free alloy which, when etched with an etching oil to form a photoengraved pattern thereon, has a high quality, high resolution photoengraved pattern.

Yet another object of this invention is to provide a method of forming a photoengraved article which does not result in the release of zinc to the environment.

A further object is the provision of novel photoengraved articles produced in accordance with this invention.

Upon further study of the specification and appended claims, further objects and advantages of this invention will become apparent to those skilled in the art.

SUMMARY OF THE INVENTION

In an article of manufacture aspect, a photoengraving article adapted when etched to form an photoengraved printing article, is provided formed of an essentially zinc-free magnesium-based alloy containing an amount of calcium effective to control lateral etching and improve the resolution of the resultant etched pattern when said photoengraving article is etched in a photoengraving etching bath.

In a method aspect, this invention relates to an improved method of forming a photoengraved article comprising the steps of forming a photoengraving article from a photoengraving alloy and etching a pattern on said article in an etching bath, which employs a photoengraving article formed of an essentially zinc-free magnesium-based alloy containing an amount of calcium effective to control lateral etching and improve the resolution of the resultant pattern.

DETAILED DISCUSSION

The photoengraving articles of this invention are formed of a magnesium-based essentially zinc-free alloy. The articles can be in the form of plates, cylinders, etc. and are produced by coating the article with light sensitive coating or enamel. As used herein, the term "photoengraving articles" is intended to embrace, inter alia, printing plates, pattern plates or mold masters, embossing dies, debossing dies, foil stamping dies, hot stamping dies, thermal cutting dies, and the like. This coated surface is exposed to light through a negative having an image thereon so as to produce an image on the coating. The exposed coating surface is then developed to form an acid-resistant coating corresponding to the image produced by exposure. This coating may be further hardened by heating. The final acid-resistant image is known in the art as the resist. Subsequently, the image-bearing surface of the plate is subjected to etching by an etching bath, containing an acid, to remove the metal which is not protected by the resist and to thus produce the image in relief. Because the alloy is essentially zinc-free, low amounts of zinc are transferred to the etching bath. Consequently, low amounts of zinc are released into the environment upon disposal of the etching bath. The term "essentially zinc-free", as used herein, refers to alloys having no more than trace amounts of zinc, e.g., less than about 0.01 percent and preferably less than 75 ppm zinc.

Prior art photoengraving alloys contain zinc as a means of regulating the rate of etching by the etching bath. The presence of zinc has been required in order to provide an etched pattern which is clean, of high resolution, and which does not contain abberations in the surfaces of the etched pattern, e.g., pimples, rough shoulders or seediness (fine pimples in reverse images). As used herein, the term "pimples" refers to unetched portions of metal found in the non-imaged area of an engraving which have a conical shape. "Seediness" refers to the presence of small pimples found at the base of the image shoulder, and are usually found in reverses. Seediness is particularly damaging to printing process plates. "Rough shoulders" refers to image shoulders which slope away from the image in a very irregular manner, rather than a smooth, continuous taper.

Although the rate of etching can be controlled by adjusting the concentration of acid in the etching bath, the degree of control afforded thereby is not sufficient to compensate for the absence of zinc in the etching bath.

The alloys employed in the present invention include calcium. It is believed that the presence of calcium compensates for the lack of zinc. Thus, when the photoengraving articles of this invention are formed of alloys which contain calcium, it is possible to control the rate and other parameters of the etching process by adjusting, e.g., the acid concentration of the etching bath, while at the same time allowing the use of an essentially zinc-free alloy. An example of an optimum etching recipe for a Master DM-35 is: 18% acid 42° Be nitric acid, Paddle speed 500 RPM, bath temperature 95% F., etchant oil 69% Hunt X-flex. The calcium in this alloy must be uniformly dispersed throughout the metal. Preferably, the calcium is added at a late stage in the formation of the alloy.

The use of calcium in such an alloy results in a photoengraving article which is of superior quality. Thus, lateral etching and the formation of pimples and seediness is substantially reduced. A photoengraved article having a clean, clear pattern results.

Preferably, the calcium is not present in segregate form, e.g., as stated above, preferably it is present in uniform concentrations throughout the alloy. As used herein "segregates" refers to agglomerations of, e.g., calcium wherein regions of increased calcium concentration are segregated from the alloy system. Inclusions or segregates in the metal of the alloy compositions herein which etch at rates slower than the bulk alloy must not be present in sizes over from about 15 to about 40 microns.

Photoengraving articles of the present invention are formed of alloys which are substantially zinc-free as defined above, but which contain an amount of calcium effective to control the etching process and provide a clean etched pattern in a photoengraved article as defined above. Generally, alloys containing from about 0.01 to about 0.04 percent, e.g., about 0.02 to 0.03 percent, calcium are preferred.

It is believed that the presence of calcium in the alloy controls the etching process by controlling the film-forming properties of the etching bath as the photoengraving article is coated with the etching bath. A photoengraved article of a quality higher than that possible with photoengraving articles formed from essentially zinc-free alloys which do not contain calcium results. Specifically, the clarity of the resultant pattern is not compromised, even though the alloy from which the article is formed is essentially zinc-free and the formation of seediness and pimples as well as undercutting of the walls or shoulders of the etched pattern is reduced.

Preferably, the alloy also contains aluminum to impart desirable mechanical characteristics to the alloy and articles formed therefrom. Preferably, the alloy comprises from about 2% to about 4%, more preferably about 3% to 4%, aluminum.

Other trace elements may be present in the alloy as well, e.g., copper, nickel, iron and manganese. Preferably, the alloys employed in forming the photoengraving articles of this invention contain a total of less than about 100 ppm and more preferably less than 50 ppm of such other metals, e.g., less than about 5 ppm copper, less than about 2 ppm nickel, less than about 50 ppm iron and less than about 20 ppm manganese.

Preferred alloys include modified PE magnesium alloys which are essentially zinc-free but which contain calcium. PE magnesium alloys are standard alloys well known in the art.

The photoengraved articles of this invention are formed by etching a photoengraving article in multi-component isostearic acid/nitric acid etching oil systems. Typically, etching oil systems are formulated from an etchant oil mixture which is added to the etching bath.

Suitable etching bath systems are disclosed in U.S. Pat. Nos. 3,935,118; 4,032,379; 3,992,234; 3,922,229; 3,736,197; 3,730,899; 3,728,180; 3,725,158 and 3,725,159, all of whose disclosures are incorporated by reference herein. Most suitable are etching bath systems of, e.g., example XVIII of U.S. Pat. No. 3,935,118.

Such etching bath systems are multi-component systems. Generally, it will be required to modify the concentrations of the components of the etching bath systems to provide optimal results. The particular formulation used will, in general, depend on the particular characteristics of the pattern which is desired in the photoengraving article and on the composition of the alloy employed. The particular formulation to be employed is routinely determinable by routine optimization experiments.

This invention also provides a method of forming a photoengraved article. The photoengraved article is formed from the magnesium-based essentially zinc-free photoengraving alloys defined above.

The methods of this invention provide an improvement wherein the alloy is essentially zinc-free. This results in the release of very low amounts of zinc to the etching bath and consequently in the release of very low amounts of zinc to the environment.

The method includes the use of a magnesium-based essentially zinc-free alloy which contains a sufficient amount of calcium effective to control the lateral etching of the etched pattern. This results in improved resolution of the resultant pattern and in a cleaner etched pattern which does not include pimples or seediness. The alloys, etchant oils and other parameters employed are those define above.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the preceding text and the following examples, all temperatures are set forth uncorrected in degrees Fahrenheit and all parts and percentages are by weight; unless otherwise indicated.

EXAMPLES

EXAMPLE 1

Photoengraving articles were prepared by extrusion from alloys set forth in Table 1. In Table 1, alloy 1 contains zinc and calcium, alloy 2, an alloy of this invention, is essentially zinc-free and contains calcium. Alloy 3 is essentially zinc and calcium free. Alloy 4 is a standard PE magnesium alloy. The photoengraving articles were coated and etched to determine the impact of removing the zinc from the alloy, while leaving calcium in the alloy. These samples were etched in an etching bath containing 20% by volume 42° B$^e$ nitric acid, 5% by volume Hunt XFLEX (isostearic acid based etching oil) and the remainder tap water. The samples were etched simultaneously with a commercial control of Dowetch PRC Redtop. The results obtained are set forth in Table 2. The results show that magnesium-based zinc-free alloys used in photoengraving articles provide a dirty etch when calcium is not present in the alloy. The etched pattern is characterized by an appearance of seediness and by the presence of pimples. The alloys which contain zinc provided a clean etched pattern without the formation of a seedy appearance or pimples and without lateral etching which is evidenced by an undercut. The essentially zinc-free alloy, containing calcium provided a clean etched pattern in one instance without the formation of pimples or a seedy appearance. In another instance the etch was clean but was characterized by broad ragged shoulders. The data show that a photoengraving article formed of an essentially zinc-free magnesium-based alloy which contains calcium can be etched to produce a clean etched pattern in spite of the fact that the alloy is essentially free of zinc. As can be seen, standard alloys containing zinc etch clean, but essentially zinc-free, magnesium-based alloys which do not also contain calcium do not perform acceptably.

TABLE 1

| Alloy | Zn | Ca | Al | Cu | Ni | Fe | Mn | Si | Mg |
|---|---|---|---|---|---|---|---|---|---|
| 1 | 1.45% | 0.03% | 3.80% | 1 ppm | 1 ppm | 17 ppm | 10 ppm | — | Balance |
| 2* | 61 ppm | 0.024% | 3.64% | 1.6 ppm | 1 ppm | 20 ppm | 14 ppm | — | Balance |
| 3 | 53 ppm | 1 ppm | 3.66% | 1 | 1 ppm | 26 ppm | 9 ppm | — | Balance |
| 4 | .7–1.6% | 0.01% min | 4.0% max | 0.005% max | | 0.005% max | 0.08% max | 0.05% max | Balance |

*Alloy of this invention

TABLE 2

| Alloy | Bath Temp F.° | Etch Time | RPM | Depth Line | Depth Tone | Comments on Etching |
|---|---|---|---|---|---|---|
| 4 | 100 | 8 min | 480 | 33/34 | 4/5/6 | Clean |
| 1 | 100 | 8 min | 480 | 35 | 5/5 | Clean Orientation |
| 2 | 100 | 8 min | 480 | 38 | 5/5 | Clean |
| 3 | 100 | 8 min | 480 | 43 | 4/4 | Dirty |
| 4 | 95 | 20 min | 480 | 79 | 6/7 | Clean |
| 1 | 95 | 20 min | 480 | 80 | 6/6 | Slight undercut |
| 2 | 95 | 20 min | 480 | 92 | 6 | Clean, Broad, Ragged shoulders |
| 3 | 95 | 20 min | 480 | 92 | 6 | Dirty Broad Ragged Shoulders |

EXAMPLE 2

Additional photoengraving articles were prepared from the alloys of Table 1. They were etched using a master DM 35 of 130 liter capacity. The etchant oil employed was Freundorfer Mago 20X which was used to prepare an etching bath comprising 5% etchant oil and 20% acid (42° Be Nitric). The bath also contained one-half ounce magnesium. The articles were etched at a speed of 400 rpm and a bath temperature of 100° F. for 6 minutes. The results are set forth in Table 3.

TABLE 3

| Alloy | Depth Dimension of Open Areas | Depth Dimension of Highlight Dots | Comments |
|---|---|---|---|
| 4 | 0.0285"–0.0325" | 0.006"–0.0065" | Good Clean Etch, no undercutting |
| 1 | 0.0285"–0.0325" | 0.006"–0.007" | Low pimpling, rough shoulders, no undercutting. |
| 2 | 0.0305"–0.036" | 0.004"–0.006" | Good clean etch |

TABLE 3-continued

| Alloy | Depth Dimension of Open Areas | Depth Dimension of Highlight Dots | Comments |
|---|---|---|---|
| 3 | 0.0375"–0.039" | 0.006"–0.008" | Wide Shoulders Wide shoulders slight roughness some small pimpling. |

EXAMPLE 3

Additional photoengraving articles were prepared from the alloys of Table 1. An etching bath similar to that of Example 3 was employed except that the bath contained 10 ounces of magnesium. The etching was conducted at 95° F., 400 rpm for 5 minutes. The results are set forth in Table 4.

TABLE 4

| Alloy | Depth Dimensions of Open Areas | Dimensions of Highlight Dots | Comments |
|---|---|---|---|
| 4 | 0.027"–0.0285" | 0.005"–0.0065" | Good Shoulders, Clean etch |
| 1 | 0.0295"–0.035" | 0.0085"–0.011" | Much small low pimpling, undercut |
| 2 | 0.026"–0.0295" | 0.005"–0.0065" | No undercutting but rough shoulders |
| 3 | 0.027"–0.0325" | 0.007"–0.0085" | No undercutting but very rough shoulders |

EXAMPLE 4

Photoengraving articles were prepared from the alloys of table 1. An etching bath similar to that of Example 3 was prepared except that the bath contained 12 ounces of magnesium. The etching was conducted at 105° F., 550 rpm at 6 minutes. The results are set forth in table 5.

TABLE 5

| Alloy | Depth Dimensions of Open Areas | Dimensions of Highlight Dots | Comments |
|---|---|---|---|
| 4 | 0.027"–0.0285" | 0.005"–0.0065" | Good Shoulders, Clean etch |
| 1 | 0.0295"–0.035" | 0.0085"–0.011" | Much small low pimpling, undercut |
| 2 | 0.026"–0.0295" | 0.005"–0.0065" | No undercutting but rough shoulders |
| 3 | 0.027"–0.0325" | 0.007"–0.0085" | No undercutting but very rough shoulders |
| 4 | 0.039"–0.0435" | 0.0055"–0.0095" | Clean Shoulders, fairly wide |
| 1 | 0.043"–0.046" | 0.008"–0.011" | Much small low pimpling, undercut on reverses |
| 2 | 0.042"–0.048" | 0.006"–0.0085" | Clean undercutting but rough shoulders |
| 3 | 0.0475"–0.052" | 0.007"–0.0115" | Some small deep pimples very rough shoulders, no undercutting |

EXAMPLE 5

Photoengraving articles were prepared from the alloys of Table 1. An etching bath was prepared using Hunt X-5K express 5% etchant oil and 42° Be Nitric acid to make the total nitric acid concentration 14%. The etchant bath contained 1.0 ounce of magnesium. The etching was conducted at 102° F., 450 rpm for a period of 8 minutes. The results are summarized in Table 6.

TABLE 6

| Alloy | Depth Dimensions of Open Areas | Dimensions of Highlight Dots | Comments |
|---|---|---|---|
| 4 | 0.035"–0.04" | 0.005"–0.0075" | Shoulders somewhat rough but no undercutting |
| 1 | 0.035"–0.039" | 0.006"–0.008" | Many pimples, rough shoulders but no undercutting |
| 2 | 0.035"–0.0425" | 0.0095"–0.014" | Many low pimples, rough shoulders, no undercutting. |
| 3 | 0.0425"–0.046" | 0.0095"–0.14" | Many low pimples, Rough shoulders, Undercut |

EXAMPLE 6

Photoengraving articles were prepared from the alloys of Table 1. An etching bath similar to that of Example 5 was employed, except that 5200 ml of acid was added to raise the concentration of acid to 18% in an attempt to avoid the pimpling and rough shoulders evidenced in Example 5. The bath contained 3 ounces magnesium and the etching was conducted at 105° F., 350 rpm for 7 minutes. The results are summarized in Table 7.

TABLE 7

| Alloy | Depth Dimensions of Open Areas | Dimensions of Highlight Dots | Comments |
|---|---|---|---|
| 4 | 0.0315"–0.0335" | 0.004"–0.005" | Shoulders much improved but a little to wide |
| 1 | 0.0325"–0.0365" | 0.0045"–0.0065" | Still some pimples but much cleaner. Shoulders look better but still a little rough and too wide |
| 2 | 0.0355"–0.0375" | 0.004"–0.0055" | Similar appearance to alloy 1 |
| 3 | 0.039"–0.0405" | 0.005"–0.007" | Rough shoulders, some low pimpling. |

EXAMPLE 7

Photoengraving articles were prepared from the alloys of Table 1. An etching bath similar to that of Example 5 was employed except that the bath contained 5 ounces of magnesium. The etching was conducted at 100° F., 350 rpm for 7½ minutes. The results were summarized in Table 8.

TABLE 8

| Alloy | Depth Dimensions of Open Areas | Dimensions of Highlight Dots | Comments |
|---|---|---|---|
| 4 | 0.0315"–0.035" | 0.0045"–0.006" | Good shoulders a little wide |
| 1 | 0.035"–0.0395" | 0.005"–0.007" | Some low pimples shoulders still a little rough |
| 2 | 0.033"–0.035" | | A few low pimples but less than alloy 1 above some shoulders a little rough and wide |
| 3 | 0.039"–0.0445" | 0.005"–0.0095" | Some low pimples, rough shoulders |

EXAMPLE 8

Photoengraving articles were prepared from the alloys of Table 1. The articles were etched with an X-flex bath which was 24 days old. The etch was not satisfactory, resulting in undercuts due to the age of the bath.

EXAMPLE 9

Photoengraving articles were prepared from the alloys of Table 1. An etching bath was prepared from Freundorfer Mago 14 etchant oil and 42° Be nitric acid 5% etchant oil and 14% were employed. The bath contained one ounce magnesium. The articles were etched at 105° F., 400 rpm for 10 minutes. The results are summarized in Table 9.

TABLE 9

| Alloy | Depth Dimensions of Open Area | Dimensions of Highlight Dots | Comments |
|---|---|---|---|
| 4 | 0.040"–0.043" | 0.005"–0.0063" | Good shoulders, a little wide. Some random pimples mostly type I |
| 1 | 0.040"–0.042" | 0.006"–0.0085" | Much pimpling almost blank-off but center almost clear. Two inch wide areas on each side in the machine direction are almost solid wall-to-wall pimples. |
| 2 | 0.0405"–0.045" | 0.0035"–0.005" | Very wide rough shoulder some random pimples |
| 3 | 0.044"–0.049" | | Low pimpling almost wall-to-wall. Very rough shoulders and wide. |

EXAMPLE 10

Photoengraving articles were prepared from the alloys of Table 1. A etching bath similar to that of Example 9 was employed except that the bath contained 43 ounces of magnesium, 16% acid and 5% etchant oil. The etching was conducted at 105° F., 500 rpm for 10 minutes. The results are summarized in Table 10.

TABLE 10

| Alloy | Depth Dimensions of Open Areas | Dimensions of Highlight Dots | Comments |
|---|---|---|---|
| 4 | 0.040"–0.0445" | 0.0055"–0.007" | Clean good shoulders |
| 1 | 0.041"–0.047" | 0.009"–0.015" | Severely undercut and many small pimples. |
| 2 | 0.0465"–0.0525" | 0.005"–0.0065" | Shoulder rough but not undercut. Some pimpling. |
| 3 | 0.050"–0.054" | 0.0045"–0.006" | Shoulder very rough with undercutting down deep. A few scattered low pimples. |

EXAMPLE 11

Photoengraving articles were prepared from the alloys of Table 1. The articles were etched in an etching bath similar to that of Example 9, except that the bath contained 45 ounces of magnesium. The articles were etched at 100° F., 400 rpm for 9 minutes. The results are summarized in Table 11.

TABLE 11

| Alloy | Depth Dimensions of Open Area | Dimensions of Highlight Dots | Comments |
|---|---|---|---|
| 4 | 0.030"–0.032" | 0.0055"–0.0065" | Clean, most shoulders ok. Reverse is very steep but no undercutting. |
| 1 | 0.0305"–0.033" | 0.0075"–0.0095" | Many small pimples, undercutting. |
| 2 | 0.0315"–0.0335" | 0.005"–0.0065" | Wide shoulders, many pimples in some areas. |
| 3 | 0.035"–0.039" | 0.004"–0.006" | Wide rough shoulders a few scattered pimples. |

EXAMPLE 12

Photoengraving articles were prepared from the alloys of Table 1. The articles were etched in an etching bath similar to Example 9 except that the bath contained 83 ounces of magnesium. The etching was conducted at 100° F., 400 rpm for 10 minutes. The results are summarized in Table 12.

TABLE 12

| Alloy | Depth Dimensions of Open Area | Dimensions of Highlight Dots | Comments |
|---|---|---|---|
| 4 | 0.025"–0.028" | 0.005"–0.0055" | Good shoulders, clean etch |
| 2 | 0.026"–0.028" | 0.0055"–0.0075" | Good shoulders, no undercutting, but many pimples. |
| 3 | 0.028"–0.031" | 0.003"–0.004" | Wide rough shoulders, many pimples. |

EXAMPLE 13

Photoengraving articles were prepared from the alloys of Table 1. The articles were etched in a Tasope D.P. 4.20, 200 liter capacity. An etching bath comprising Hunt X-flex 42° Be nitric acid and water was prepared comprising 5% etchant oil and 20% acid. 109.5 ounces of magnesium were present in the bath. The etching was conducted in 105° F., at 480 rpm for 8 minutes. The results are summarized in Table 13.

TABLE 13

| Alloy | Depth Dimensions of Open Area | Dimensions of Highlight Dots | Comments |
|---|---|---|---|
| 4 | 0.0415"–0.044" | 0.0045"–0.0075" | Clean etch, steep shoulders, some slight undercutting. |
| 2 | 0.043"–0.0465" | 0.008"–0.011" | Rough shoulders, slight undercut. Many small pimples in some areas. |
| 3 | 0.042"–0.044" | 0.008"–0.010" | Steep, rough shoulders but not undercut. Scattered pimples. |

Collectively, the data in the above examples demonstrate that photoengraving articles formed of magnesium-based, essentially zinc-free alloys which contain calcium can be etched to produce a clean etched pattern in spite of the fact that the alloy is essentially free of zinc. As can be seen, standard alloys which also contain zinc also etch clean but essentially zinc-free magnesium-based alloys which do not also contain calcium do not perform acceptably.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a photoengraved printing article, having an etched pattern in a surface thereof, produced by etching the surface on a photoengraving bath, the improvement wherein the photoengraving surface thereof is formed of an essentially zinc-free magnesium-based alloy containing no more than a trace amount of zinc and an amount of calcium effective to improve the resolution of the etched pattern.

2. A photoengraving article of claim 1 wherein said alloy contains from about 0.01% to about 0.04% calcium.

3. A photoengraving article of claim 1 wherein said alloy further comprises from about 2% to about 4% aluminum.

4. A photoengraving article of claim 1 wherein said alloy contains less than about 0.01% zinc.

5. A photoengraving article of claim 2 wherein said alloy contains about 2% to about 4% aluminum and less than about 0.01% zinc.

6. A photoengraving article of claim 1 wherein said alloy contains from about 0.02% to about 0.03% calcium, from about 3% to about 4% aluminum and less than about 75 ppm zinc.

7. A photoengraving article of claim 6 wherein said alloy contains less than 100 ppm of any other metals.

8. In a method of forming a photoengraved article comprising the steps of forming a photoengraving article from a photoengraving alloy and etching a pattern on said article in an etching bath, the improvement comprising employing a photoengraving article formed of an essentially zinc-free magnesium-based alloy containing an amount of calcium effective to control lateral etching and improve the resolution of the resultant pattern.

9. A method of claim 8 wherein said alloy contains from about 0.01% to about 0.04% calcium.

10. A method of claim 8 wherein said alloy further comprises from about 2% to about 4% aluminum.

11. A method of claim 8 wherein said alloy contains less than about 0.01% zinc.

12. A method of claim 8 wherein said alloy contains about 2% to about 4% aluminum and less than about 0.01% zinc.

13. A method of claim 8 wherein said alloy contains from about 0.02% to about 0.03% calcium, from about 3% to about 4% aluminum and less than about 75 ppm zinc.

14. A method of claim 8 wherein said alloy contains less than 100 ppm of any other metals.

15. A photoengraved article produced according to the method of claim 8.

16. A photoengraved article produced according to the method of claim 13.

17. A photoengraving article adapted when etched to form a photoengraved printing article, formed of an essentially zinc-free magnesium-based alloy comprising from about 2% to about 4% aluminum and containing an amount of calcium effective to improve the resolution of the resultant etched pattern when said photoengraving article is etched in a photoengraving etching bath.

18. A photoengraving article of claim 17, wherein said alloy contains from about 0.01% to about 0.04% calcium.

19. A photoengraving article of claim 17, wherein said alloy contains less than about 0.01% zinc.

20. An essentially zinc-free, magnesium-based photoengraving alloy comprising from about 2% to about 4% aluminum and containing an amount of calcium effective to improve, compared to an otherwise identical alloy lacking said amount of calcium, the resolution of an etched pattern on the surface of a photoengraving article formed therefrom when said alloy is etched in a photoengraving etching bath.

21. An alloy of claim 20 containing from about 0.01% to about 0.04% calcium.

22. An alloy of claim 20 containing less than about 0.01% zinc.

23. An alloy of claim 20 containing less than about 100 ppm of metals other than magnesium, aluminum and calcium.

24. An essentially zinc-free, magnesium-based alloy comprising from about 2% to about 4% aluminum and from about 0.01% to about 0.04% calcium.

25. An alloy of claim 24 containing less than about 0.01% zinc.

26. An alloy of claim 24 containing less than about 100 ppm of metals other than magnesium, aluminum and calcium.

* * * * *

UNITED STATES PATENT AND TRADEMARK OFFICE
CERTIFICATE OF CORRECTION

PATENT NO. : 4,751,162

DATED : Jun. 14, 1988

INVENTOR(S) : Geoffrey S. Newhouse

It is certified that error appears in the above-identified patent and that said Letters Patent is hereby corrected as shown below:

Col. 3, line 23, delete "coating", second occurrence, and insert --coated--.

Col. 8, Table 6, under "Dimensions of Highlight Dots" heading, Alloy 3, delete "0.0095"-0.14" " and insert --0.0095"-0.014"--.

Signed and Sealed this

Twelfth Day of September, 1989

Attest:

DONALD J. QUIGG

Attesting Officer

Commissioner of Patents and Trademarks